United States Patent
Glushkov et al.

(10) Patent No.: US 9,082,521 B2
(45) Date of Patent: Jul. 14, 2015

(54) EUV MULTILAYER MIRROR WITH INTERLAYER AND LITHOGRAPHIC APPARATUS USING THE MIRROR

(75) Inventors: Denis Alexandrovich Glushkov, Witten (DE); Vadim Yevgenyevich Banine, Deurne (NL); Leonid Aizikovitch Sjmaenok, Vaals (NL); Nikolay Nikolaevitch Salashchenko, Nizhny Novgorod (RU); Nikolay Ivanovich Chkhalo, Nizhny Novgorod (RU)

(73) Assignee: ASML NETHERLANDS B.V., Veldhoven (NL)

( * ) Notice: Subject to any disclaimer, the term of this patent is extended or adjusted under 35 U.S.C. 154(b) by 1003 days.

(21) Appl. No.: 13/201,242

(22) PCT Filed: Jan. 11, 2010

(86) PCT No.: PCT/EP2010/050195
§ 371 (c)(1),
(2), (4) Date: Aug. 12, 2011

(87) PCT Pub. No.: WO2010/091907
PCT Pub. Date: Aug. 19, 2010

(65) Prior Publication Data
US 2011/0292366 A1     Dec. 1, 2011

Related U.S. Application Data

(60) Provisional application No. 61/152,580, filed on Feb. 13, 2009.

(51) Int. Cl.
| G02B 5/08 | (2006.01) |
| G21K 1/06 | (2006.01) |
| B82Y 10/00 | (2011.01) |
| B82Y 40/00 | (2011.01) |
| G03F 1/24 | (2012.01) |
| G03F 7/20 | (2006.01) |

(52) U.S. Cl.
CPC .............. *G21K 1/062* (2013.01); *B82Y 10/00* (2013.01); *B82Y 40/00* (2013.01); *G02B 5/085* (2013.01); *G02B 5/0816* (2013.01); *G02B 5/0891* (2013.01); *G03F 1/24* (2013.01); *G03F 7/70316* (2013.01); *G03F 7/70941* (2013.01); *G03F 7/70958* (2013.01)

(58) Field of Classification Search
None
See application file for complete search history.

(56) References Cited

U.S. PATENT DOCUMENTS

| 5,485,499 | A | 1/1996 | Pew et al. |
| 6,150,022 | A | 11/2000 | Coulter et al. |
| 6,724,465 | B2 | 4/2004 | Babonneau et al. |
| 7,217,940 | B2 | 5/2007 | Partlo et al. |
| 7,375,794 | B2 | 5/2008 | Box |
| 8,139,200 | B2 | 3/2012 | Van Herpen et al. |
| 8,411,355 | B2 * | 4/2013 | Tsarfati et al. ............ 359/359 |
| 2003/0185341 | A1 | 10/2003 | Michaelsen |
| 2004/0130693 | A1 | 7/2004 | Kurt |
| 2011/0080573 | A1 * | 4/2011 | Glushkov et al. ............ 355/71 |
| 2011/0194087 | A1 * | 8/2011 | Tsarfati et al. ............ 355/67 |

FOREIGN PATENT DOCUMENTS

| CN | 1499297 A | 5/2004 |
| JP | 3-75600 | 3/1991 |
| JP | 7-244199 | 9/1995 |
| JP | 2004-128490 | 4/2004 |
| JP | 2006-501444 | 1/2006 |
| JP | 2006-49909 | 2/2006 |
| JP | 2006-173490 | 6/2006 |
| JP | 2006-310793 | 11/2006 |
| JP | 2007-198782 | 8/2007 |
| JP | 2007-298980 | 11/2007 |
| TW | 539911 | 7/2003 |
| TW | I286891 | 9/2007 |
| WO | 2004/023495 A1 | 3/2004 |
| WO | 2004/086522 | 10/2004 |
| WO | 2010/003487 A1 | 1/2010 |

OTHER PUBLICATIONS

T. Tsarfati, R. W. E. van de Kruijs, E. Zoethout, E. Louis, F. Bijkerk, 'Reflective multilayer optics for 6.7 nm wavelength radiation sources and next generation lithography', Thin Solid Films, vol. 518, 2009, pp. 1365-1368.*

(Continued)

*Primary Examiner* — Arnel C Lavarias
(74) *Attorney, Agent, or Firm* — Pillsbury Winthrop Shaw Pittman LLP

(57) ABSTRACT

A multilayer mirror to reflect radiation having a wavelength in the range of 2-8 nm has alternating layers. The alternating layers include a first layer and a second layer. The first and second layers are selected from the group consisting of: U and $B_4C$ layers, Th and $B_4C$ layers, La and $B_9C$ layers, La and $B_4C$ layers, U and $B_9C$ layers, Th and $B_9C$ layers, La and B layers, U and B layers, C and B layers, Th and B layers, U compound and $B_4C$ layers, Th compound and $B_4C$ layers, La compound and $B_9C$ layers, La compound and $B_4C$ layers, U compound and a $B_9C$ layers, Th compound and a $B_9C$ layers, La compound and a B layers, U compound and B layers, and Th compound and a B layers. An interlayer is disposed between at least one of the first layers and the second layer.

15 Claims, 9 Drawing Sheets

(56) References Cited

OTHER PUBLICATIONS

S. S. Andreev, M. M. Barysheva, N. I. Chkhalo, S. A. Gusev, A. E. Pestov, V. N. Polkovnikov, D. N. Rogachev, N. N. Salashchenko, Y. A. Vainer, S, Y. Zuev, 'Multilayer x-ray mirrors based on La/B4C and La/B9C', Technical Physics, vol. 55, No. 8, 2010, pp. 1168-1174.*

European Office Action dated Jan. 9, 2013 in corresponding European Patent Application No. 10 700 234.7.

Holleman-Wiberg, "Lehrbuch der Anorganischen Chemie," Walter de Gruyter, Berlin-New York, pp. 277-280, pp. 798-799, pp. 1057-1058, and p. 1089 (1985).

G.D. Bagde et al., "Spray deposition of lanthanum selenide ($La_2Se_3$) thin films from non-aqueous medium and their characterizations," Materials Chemistry and Physics, vol. 80, pp. 714-718 (2003).

CRC Handbook of Chemistry and Physics, $93^{rd}$ Edition, Internet Version 2013, pp. 4-43-4-44 and p. 4-69.

Written Opinion for PCT International Patent Application No. PCT/EP2010/050195, mailed Aug. 25, 2011.

Andreev et al., Multilayered mirrors based on La/B4C(B9C) for X-ray range near anomalous dispersion of boron ($\lambda \approx 6.7nm$), Nuclear Instruments and Methods in Physics Research A, 603, 2009, pp. 80-82.

European Examination Report dated Jul. 1, 2014 in corresponding European Patent Application No. 10700234.7.

Holleman-Wiberg, "Lehrbuch der Anorganischen Chemie," Walter de Gruyter, Berlin-New York, pp. 1587-1601, (Jan. 1, 2007).

International Search Report for PCT International Patent Application No. PCT/EP2010/050195, mailed Jul. 7, 2010.

* cited by examiner

EUV MULTILAYER MIRROR WITH INTERLAYER AND LITHOGRAPHIC APPARATUS USING THE MIRROR

CROSS-REFERENCE TO RELATED APPLICATIONS

This application is the United States national phase application of PCT/EP2010/050195, which was filed on Jan. 11, 2010 and claims the benefit of priority from U.S. Provisional Patent Application No. 61/152,580, filed Feb. 13, 2009, the content of which is incorporated herein by reference in its entirety.

FIELD

The present invention relates to a multilayer mirror and a lithographic apparatus that includes such a multilayer mirror.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A lithographic apparatus typically includes an illumination system configured to condition a radiation beam; a support structure constructed to hold a patterning device, mostly a reticle or mask, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13.5 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

Preferably, both the illumination system and the projection system include a plurality of optical elements in order to focus the radiation on the desired locations on the patterning device and the substrate, respectively. Unfortunately, apart from some gasses at low density, no materials are known to be transmissive to EUV radiation. Therefore, the lithographic apparatus using EUV radiation does not employ lenses in its illumination system and in its projection system. Instead, the illumination system and the projection system preferably include mirrors. In addition, the patterning device is preferably a reflective device, i.e. a mirror having a reflective surface provided with an pattern formed by an absorptive material on the reflective surface, for the same reason.

To reflect EUV radiation having a wavelength of about 6.9 nm, multilayer mirrors have been proposed having alternating layers of a metal, such as La, U or Th, and B or a B compound, such as $B_4C$ or $B_9C$. Such a multilayer mirror reflects the EUV radiation according to Bragg's Law. However, chemical interaction of for instance La and the B layer or the B compound layer leads to interlayer diffusion.

SUMMARY

According to an aspect of the present invention, there is provided a mirror constructed and arranged to reflect radiation having a wavelength in the range of about 6.4 nm-about 7.2 nm, preferably having a wavelength in the range of 6.4 nm-7.2 nm. The multilayer mirror has alternating layers. The alternating layers include a first layer and a second layer. The first and second layers are selected from the group consisting of: La and $B_4C$ layers, U and $B_4C$ layers, Th and $B_4C$ layers, La and $B_9C$ layers U and $B_9C$ layers, Th and $B_9C$ layers, La and B layers, U and B layers, C and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers, wherein at least one of the first layers is separated from a second layer by an interlayer disposed between the at least one of the first layers and the second layer. Preferably, each of the layers of a plurality of the layers is separated from each of the second layers by an interlayer. The interlayer may be selected from the group consisting of: a Sn layer, a Mo layer, and a Cr layer.

The first layer may be a U compound layer which comprises one or more from the group consisting of $UF_3$, $UF_4$, $UF_5$, $UCl_3$, $UCl_4$, $UCl_5$, $UI_3$, $UI_4$, UO, $UO_2$, $UO_3$, $U_3O_8$, $U_2O_5$, $U_3O_7$, $U_4O_9$, $UTe_2$, $UTe_3$, UN, $U_2N_3$, and $U_3N_2$. Alternatively or additionally, the first layer may be a Th compound layer which comprises one or more from the group consisting of $ThF_3$, $ThF_4$, $ThCl_4$, $ThI_2$, $ThI_3$, $ThI_4$, $ThH_2$, $ThO_2$, $ThSe_2$, and ThN. Yet another possibility is that the first layer is a La compound layer which comprises one or more from the group consisting of $LaH_2$, $LaH_3$, $LaF_3$, $LaCl_3$, $LaI_3$, $La_2O_3$, LaSe, and LaTe.

Typically, the mirror may be comprised in a projection system configured to project a patterned radiation beam onto a target portion of a substrate or the mirror may be comprised in an illumination system configured to condition a radiation beam.

According to another aspect of the present invention, the projection system and/or the illumination system are comprised in a lithographic apparatus further comprising a support structure constructed to hold a patterning device, the patterning device being capable of imparting the radiation beam with a pattern in its cross-section to form a patterned radiation beam, and a substrate table constructed to hold a substrate.

According to an aspect of the present invention, there is provided a projection system configured to project a patterned radiation beam onto a target portion of a substrate. The projection system includes a multilayer mirror constructed and arranged to reflect radiation having a wavelength in the range of 6.2-7.2 nm. The multilayer mirror has alternating layers. The alternating layers include a first layer and a second layer. The first and second layers are selected from the group consisting of: U and $B_4C$ layers, Th and $B_4C$ layers, La and $B_9C$ layers U and $B_9C$ layers, Th and $B_9C$ layers, La and B layers, U and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers, wherein at least one of the first layers is separated from a second layer by an interlayer disposed between the at least one of the first layers and the second layer. Preferably, each of the layers of a plurality of the layers is separated from each of the second layers by an interlayer.

According to an aspect of the present invention, there is provided a projection system configured to project a patterned radiation beam onto a target portion of a substrate. The projection system includes a multilayer mirror constructed and arranged to reflect radiation having a wavelength in the range of about 6.4 nm-about 7.2 nm. The multilayer mirror has a reflective surface provided with a capping layer that includes Ru, Rh, Ta, Ti, or any combination thereof.

According to an aspect of the present invention, there is provided an illumination system configured to condition a radiation beam. The illumination system includes a multilayer mirror constructed and arranged to reflect radiation having a wavelength in the range of about 6.4 nm-about 7.2 nm. The multilayer mirror has alternating layers. The alternating layers include a first layer and a second layer. The first and second layers are selected from the group consisting of: U and $B_4C$ layers, Th and $B_4C$ layers, La and $B_9C$ layers U and $B_9C$ layers, Th and $B_9C$ layers, La and B layers, U and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers, wherein at least one of the first layers is separated from a second layer by an interlayer disposed between the at least one of the first layers and the second layer. Preferably, each of the layers of a plurality of the layers is separated from each of the second layers by an interlayer.

According to an aspect of the present invention, there is provided an illumination system configured to condition a radiation beam. The illumination system includes a multilayer mirror constructed and arranged to reflect radiation having a wavelength in the range of about 6.4 nm-about 7.2 nm. The multilayer mirror has a reflective surface provided with a capping layer that includes Ru, Rh, Ta, Ti, or any combination thereof.

According to an aspect of the present invention, there is provided a lithographic projection apparatus arranged to project a pattern from a patterning device onto a substrate. The lithographic apparatus includes a multilayer mirror constructed and arranged to reflect radiation having a wavelength in the range of about 6.4 nm-about 7.2 nm. The multilayer mirror has alternating layers. The alternating layers include a first layer and a second layer. The first and second layers are selected from the group consisting of: U and $B_4C$ layers, Th and $B_4C$ layers, La and $B_9C$ layers U and $B_9C$ layers, Th and $B_9C$ layers, La and B layers, U and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers, wherein at least one of the first layers is separated from a second layer by an interlayer disposed between the at least one of the first layers and the second layer. Preferably, each of the layers of a plurality of the layers is separated from each of the second layers by an interlayer.

According to an aspect of the present invention, there is provided a lithographic projection apparatus arranged to project a pattern from a patterning device onto a substrate. The lithographic apparatus includes a multilayer mirror constructed and arranged to reflect radiation having a wavelength in the range of about 6.4 nm-about 7.2 nm. The multilayer mirror has a reflective surface provided with a capping layer that includes Ru, Rh, Ta, Ti, or any combination thereof.

According to an aspect of the present invention, there is provided a lithographic apparatus that includes an illumination system configured to condition a radiation beam, and a support structure constructed to hold a patterning device. The patterning device is capable of imparting the radiation beam with a pattern in its cross-section to form a patterned radiation beam. The apparatus also includes a substrate table constructed to hold a substrate, and a projection system configured to project the patterned radiation beam onto a target portion of the substrate. The illumination system and/or the projection system includes a multilayer mirror constructed and arranged to reflect radiation having a wavelength in the range of about 6.4 nm-about 7.2 nm. The multilayer mirror has alternating layers. The alternating layers include a first layer and a second layer. The first and second layers are selected from the group consisting of: U and $B_4C$ layers, Th and $B_4C$ layers, La and $B_9C$ layers U and $B_9C$ layers, Th and $B_9C$ layers, La and B layers, U and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers, wherein at least one of the first layers is separated from a second layer by an interlayer disposed between the at least one of the first layers and the second layer. Preferably, each of the layers of a plurality of the layers is separated from each of the second layers by an interlayer.

Each first layer of a plurality of first layers may be separated from a second layer by an interlayer. The interlayer may be selected from the group consisting of: a Sn layer, a Mo layer, a Cr layer, a Sn compound layer, a Mo compound layer, and a Cr compound layer.

The interlayer may selected from the group consisting of: a Sn layer, a Mo layer, a Cr layer, a Sn compound layer, a Mo compound layer, and a Cr compound layer. If the interlayer is a Sn compound layer, the Sn compound may include at least one of the group consisting of $SnF_2$, $SnF_4$, $SnCl_2$, $SnCl_4$, $SnI_2$, $SnI_4$, SnO, $SnO_2$, SnSe, $SnSe_2$, and SnTe. If the interlayer is a Cr compound layer, the Cr compound may include at least one of $CrF_2$, $CrF_3$, $CrF_4$, $CrCl_2$, $CrCl_3$, $CrCl_4$, $CrI_2$, $CrI_3$, $CrI_4$, $CrO_2$, $CrO_3$, $Cr_2O_3$, $Cr_3O_4$, CrN, CrSe, and $Cr_2Te_3$. If the interlayer is a Mo compound layer, the Mo compound may include at least one of the group consisting of $MoF_3$, $MoF_4$, $MoCl_2$, $MoCl_3$, $MoCl_4$, $MoI_2$, $MoI_3$, $MoI_4$, MoO, $MoO_2$, $MoO_3$, $MoSe_2$, $MoTe_2$, and MoN.

In an embodiment of the multilayer mirror, the first layer may be a Th compound layer, wherein the Th compound layer includes one or more from the group consisting of $ThF_3$, $ThF_4$, $ThCl_4$, $ThI_2$, $ThI_3$, $ThI_4$, $ThH_2$, $ThO_2$, $ThSe_2$, and ThN. In another embodiment of the multilayer mirror, the first layer may be a U compound layer, wherein the U compound layer includes one or more from the group consisting of $UF_3$, $UF_4$, $UF_5$, $UCl_3$, $UCl_4$, $UCl_5$, $UI_3$, $UI_4$, UO, $UO_2$, $UO_3$, $U_3O_8$, $U_2O_5$, $U_3O_7$, $U_4O_9$, $UTe_2$, $UTe_3$, UN, $U_2N_3$, and $U_3N_2$. In yet another embodiment of the multilayer mirror, the first layer may be a La compound layer, wherein the La compound layer includes one or more from the group consisting of $LaH_2$, $LaH_3$, $LaF_3$, $LaCl_3$, $LaI_3$, $La_2O_3$, LaSe, and LaTe.

According to an aspect of the present invention, there is provided a lithographic apparatus that includes an illumination system configured to condition a radiation beam, and a support structure constructed to hold a patterning device. The patterning device is capable of imparting the radiation beam with a pattern in its cross-section to form a patterned radiation beam. The apparatus also includes a substrate table constructed to hold a substrate, and a projection system configured to project the patterned radiation beam onto a target portion of the substrate. The illumination system and/or the projection system includes a multilayer mirror constructed and arranged to reflect radiation having a wavelength in the range of 2-8 nm. The multilayer mirror has a reflective surface provided with a capping layer that includes Ru, Rh, Ta, Ti, or any combination thereof.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
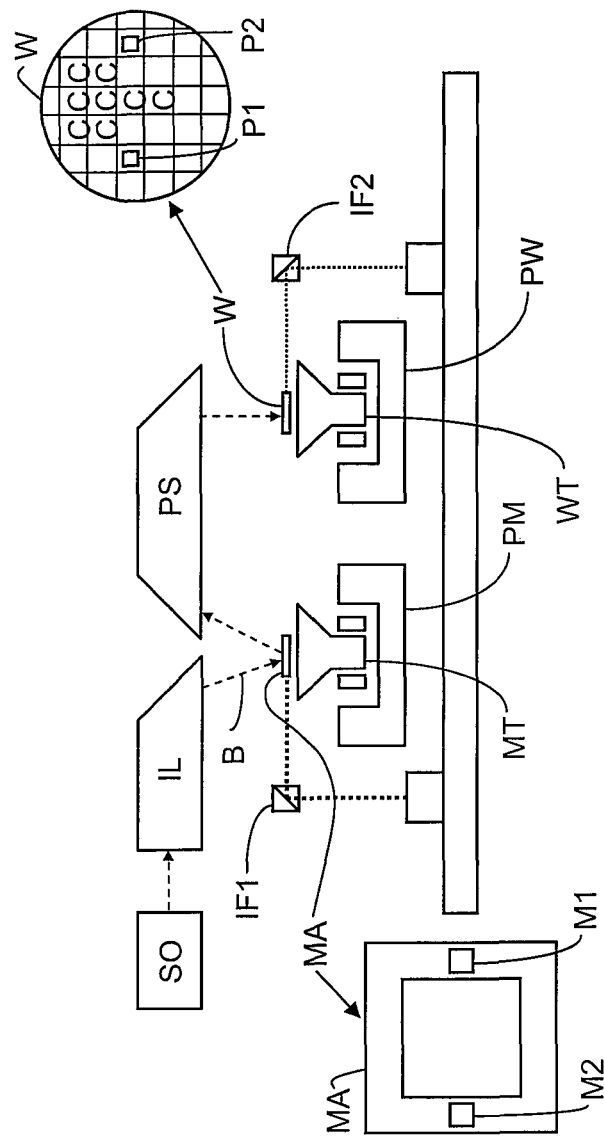
FIG. 1 schematically depicts a lithographic apparatus according to an embodiment of the present invention.

FIG. 1 schematically depicts a lithographic apparatus according to an embodiment of the invention. The apparatus includes: an illumination system (illuminator) IL configured to condition a radiation beam B (e.g. EUV radiation); a patterning device support or support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation. However, optical components which are configured to condition the radiation beam B are preferably reflective components.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive, but is preferably reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors, especially the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may include an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
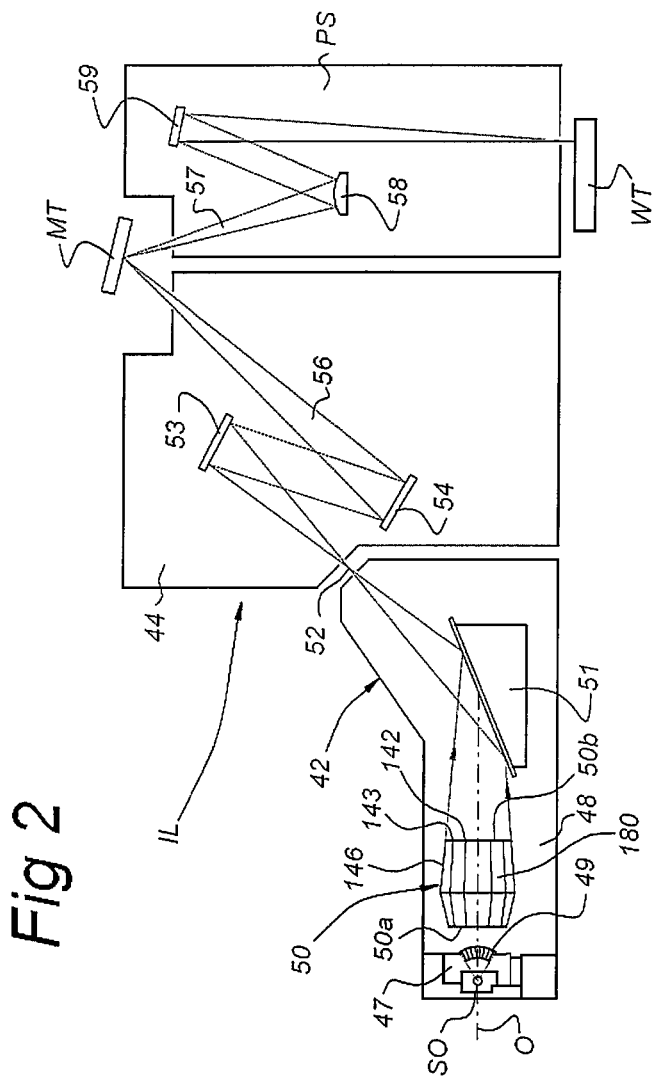
FIG. 2 schematically depicts a side view of an EUV illumination system and projection system of the lithographic projection apparatus of FIG. 1.

FIG. 2 shows the lithographic apparatus of FIG. 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be desired for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art. The collector 50 may be a nested collector with reflectors 142, 143, and 146. A space 180 is provided between two reflectors, e.g. between reflectors 142 and 143.

Figure 3:
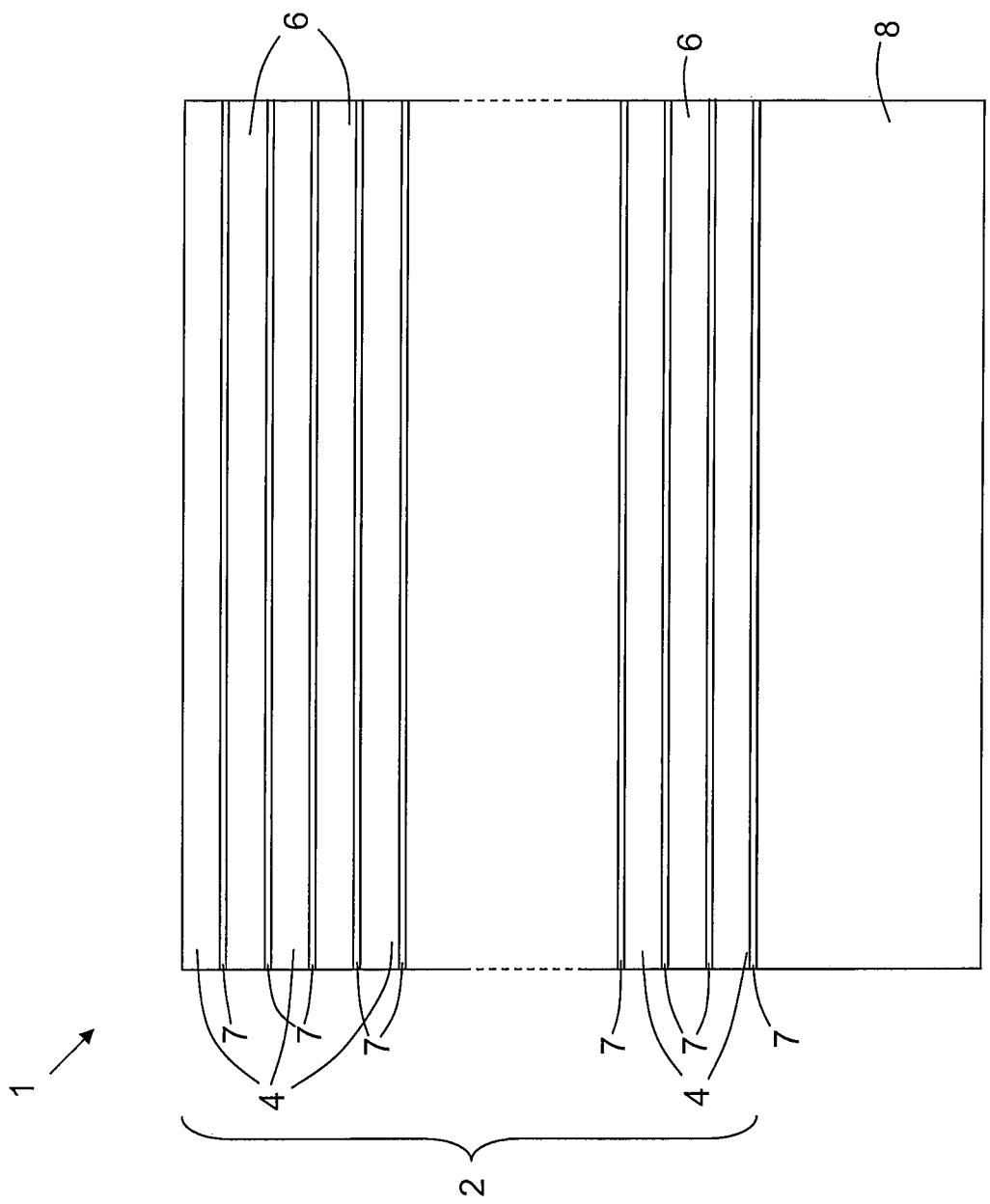
FIG. 3 schematically depicts a multilayer mirror of the lithographic apparatus of FIG. 1 according to an embodiment of the present invention.

FIG. 3 depicts an embodiment of a multilayer mirror 1. The multilayer mirror 1 is constructed and arranged to reflect radiation having a wavelength in the range of about 6.4 nm-about 7.2 nm. The multilayer mirror includes a layered structure 2 which has alternating layers 4, 6 supported by a substrate 8. In embodiments of the invention, the multilayer mirror may be located in various parts of the lithographic apparatus, such as the projection system and the illumination system.

The alternating layers 4, 6 may be selected from the group consisting of: La and $B_4C$ layers, U and $B_4C$ layers, Th and $B_4C$ layers, La and $B_9C$ layers U and $B_9C$ layers, Th and $B_9C$ layers, La and B layers, U and B layers, and Th and B layers.

In an embodiment, the alternating layers 4, 6 may be selected from the group consisting of: U and $B_4C$ layers, Th and $B_4C$ layers, U and $B_9C$ layers, Th and $B_9C$ layers, U and B layers, Th and B layers U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers. Examples of suitable U compounds are $UF_3$, $UF_4$, $UF_5$, $UCl_3$, $UCl_4$, $UCl_5$, $UI_3$, $UI_4$, $UO$, $UO_2$, $UO_3$, $U_3O_8$, $U_2O_5$, $U_3O_7$, $U_4O_9$, $UTe_2$, $UTe_3$, $UN$, $U_2N_3$, and $U_3N_2$. Examples of suitable Th compounds are $ThF_3$, $ThF_4$, $ThCl_4$, $ThI_2$, $ThI_3$, $ThI_4$, $ThH_2$, $ThO_2$, $ThSe_2$, and $ThN$. Examples of suitable La compounds are $LaH_2$, $LaH_3$, $LaF_3$, $LaCl_3$, $LaI_3$, $La_2O_3$, $LaSe$, and $LaTe$.

A potential benefit of such alternating layers is that U layers or Th layers instead of La layers will provide a broad bandwidth, both in terms of angle as well as wavelength. The broad angle bandwidth will allow for a good amount of design freedom, making the multilayer mirror useful for optics in EUV lithography at 6.6 nm wavelength. Also, it may allow for a pupil of an optical system in which the multilayer mirror is included to be homogeneously filled in terms of intensity and allows for a larger numerical aperture (NA).

It can be seen in FIGS. 3, 5, 6 and 7 that between a first layer 4, for instance a La layer and a second layer 6, for instance a $B_4C$ layer, an interlayer 7 is provided configured to prevent diffusion between the first layer 4 and the second layer 6. Such an interlayer may have a thickness between about 0.2 nm and about 1 nm. Preferably, each of the first layers 4 is separated from each of the second layers 6 by such an interlayer 7.

The interlayer 7 may be a Sn layer, a Mo layer, or a Cr layer. Alternatively, the interlayer may be a Sn compound, such as $SnF_2$, $SnF_4$, $SnCl_2$, $SnCl_4$, $SnI_2$, $SnI_4$, $SnO$, $SnO_2$, $SnSe$, $SnSe_2$, or $SnTe$, a Cr compound, such as $CrF_2$, $CrF_3$, $CrF_4$, $CrCl_2$, $CrCl_3$, $CrCl_4$, $CrI_2$, $CrI_3$, $CrI_4$, $CrO_2$, $CrO_3$, $Cr_2O_3$, $Cr_3O_4$, $CrN$, $CrSe$, or $Cr_2Te_3$, or a Mo compound, such as $MoF_3$, $MoF_4$, $MoCl_2$, $MoCl_3$, $MoCl_4$, $MoI_2$, $MoI_3$, $MoI_4$, $MoO$, $MoO_2$, $MoO_3$, $MoSe_2$, $MoTe_2$, or $MoN$.

As a person skilled in the art will readily acknowledge, the alternating layers 4, 6 and the interlayers 7 multilayer mirrors 1 of FIGS. 3, 5, 6 and 7 can be manufactured by way of deposition techniques such as magnetron sputtering or electron beam sputtering.

Figure 4A:
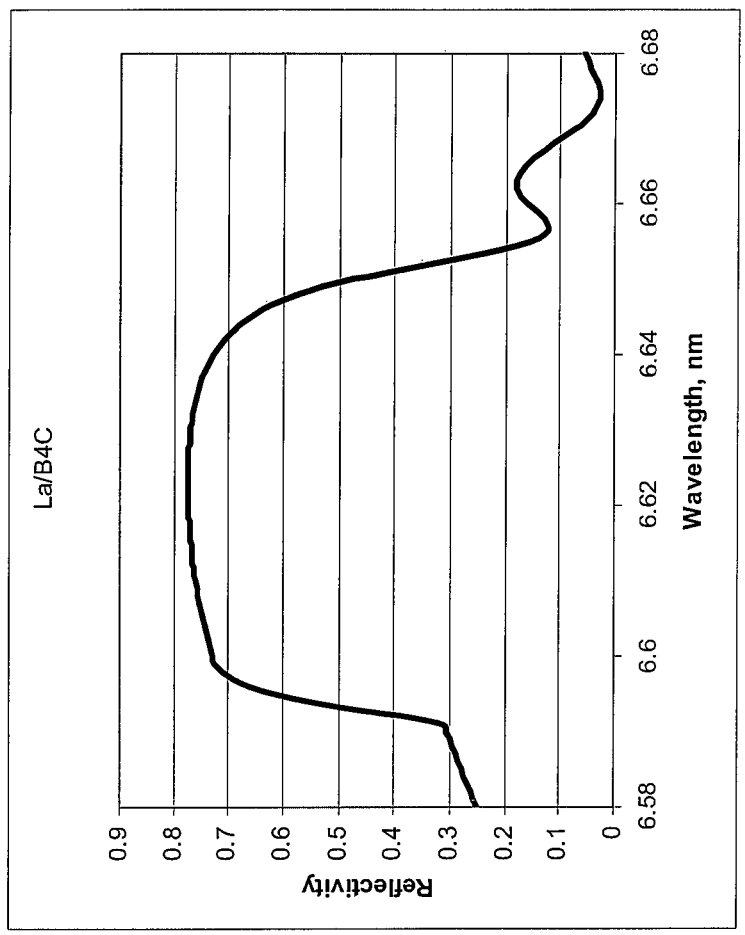
FIGS. 4a, 4b, and 4c depict reflectance of embodiments of the multilayer mirror of FIG. 3 as a function of wavelength.
Figure 4B:
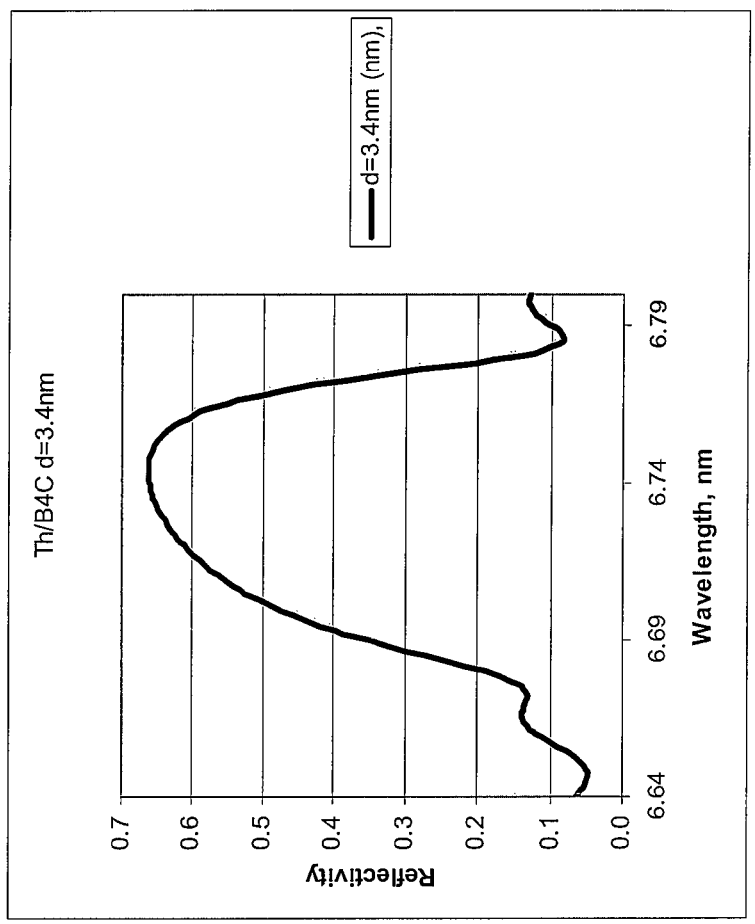
Figure 4C:
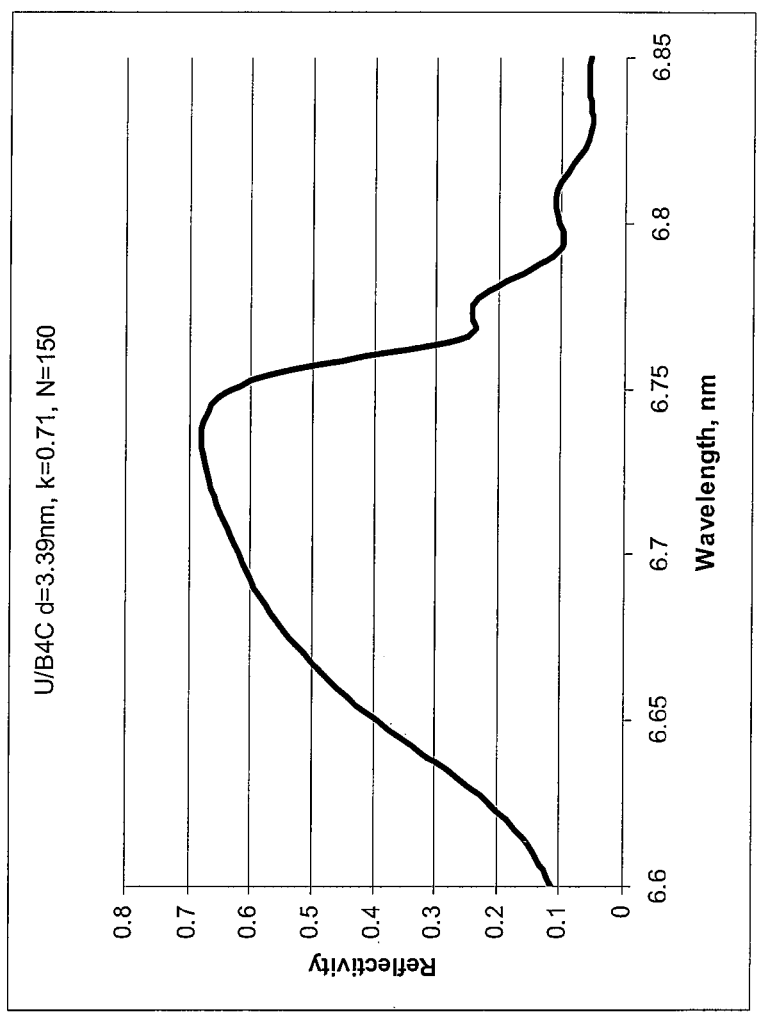

FIG. 4a is a graph showing reflectance R as a function of wavelength X for alternating layers which are La and $B_4C$ layers. The so-called full width half maximum (FWHM) of the peak shown is 0.06 nm. FIG. 4b shows reflectance as a function of wavelength λ for alternating layers which are Th and $B_4C$ layers ($Th/B_4C$ layers). Here, the FWHM is 0.09 nm. FIG. 4c shows reflectance as a function of wavelength λ for alternating layers which are Th and $B_4C$ layers ($U/B_4C$ layers). Here, the FWHM is 0.15 nm.

In an embodiment, $Th/B_9C$ layers and $U/B_9C$ layers or even Th/B layers and U/B layers may be used instead of $Th/B_4C$ layers and $U/B_4C$ layers respectively. An increased B purity may allow for better reflectivity, thereby potentially reducing power losses due to absorption of radiation.

In an embodiment, the alternating layers may be C and $B_4C$ layers, C and $B_9C$ layers, or C and B layers. C is not as active as La and, therefore, in these alternating layers not as much interlayer diffusion may occur as in $La/B_4C$ layers.

A period, which may well be the sum of a thickness of the first layer 4 and a thickness of the second layer 6 and two antidiffusion layers 7, may be within the range of 3-3.5 nm. The alternating layers may have a period thickness which is between about 1.7 and about 2.5 times the thickness of the first layer or the second layer.

Figure 5:
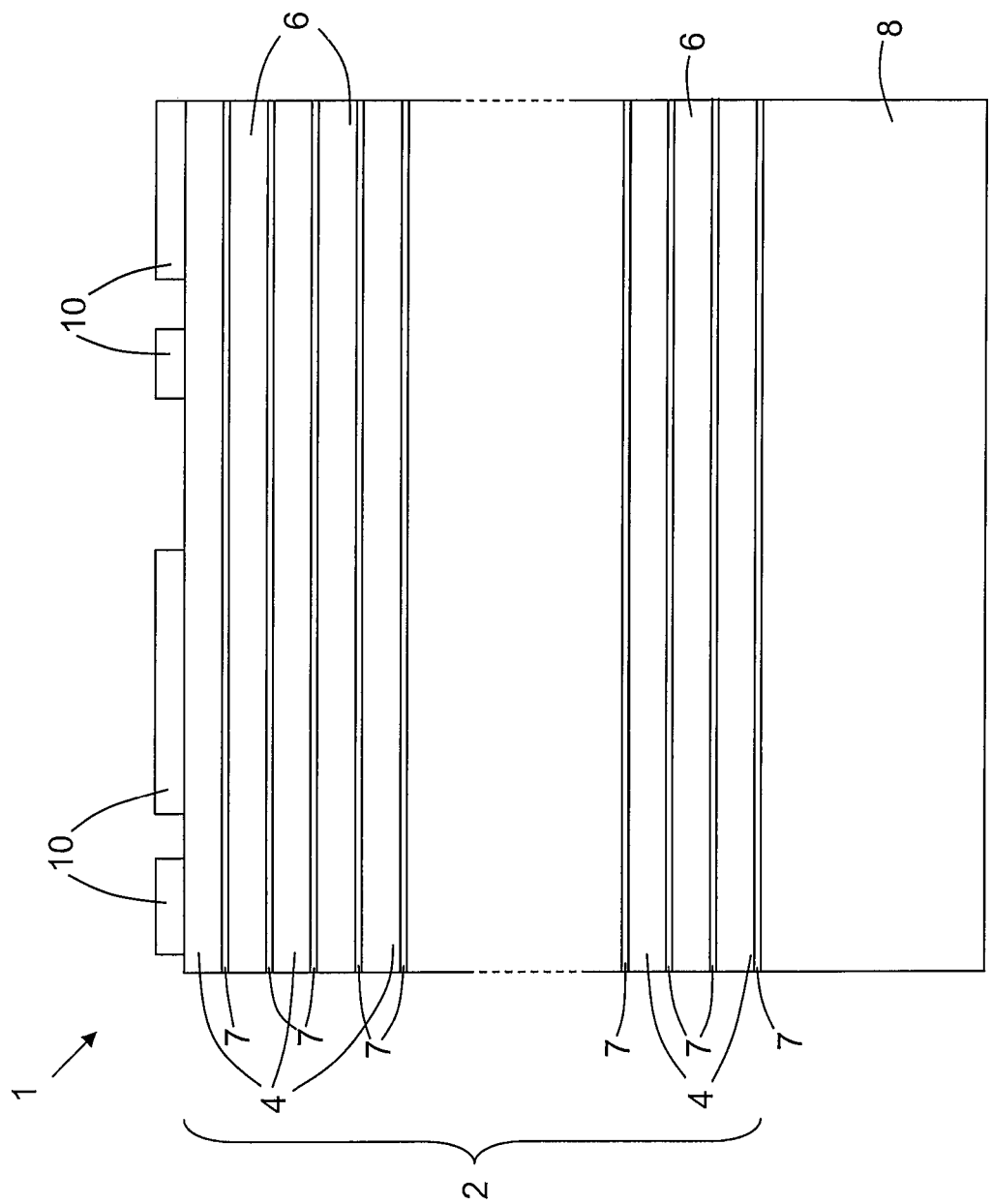
FIG. 5 depicts an embodiment of the multilayer mirror of the lithographic apparatus of FIG. 1.

An embodiment of the multilayer mirror 1 is shown in FIG. 5. This embodiment is a reflective reticle. In addition to the features of the multilayer mirror of FIG. 3, the embodiment of FIG. 5 may be provided with a structure 10 having an absorptive material which is arranged to define the pattern on its surface. Suitable materials to be employed as the absorptive material may be Cr, Ti, Si, Ru, Mo, Ta, Al, or any combination thereof.

The multilayer structure 2 of the multilayer mirror 1 may be supported by a substrate 8 in order to reduce mechanical vulnerability. Also, it is to be noted that the dotted lines in FIGS. 3 and 5 indicate an unspecified number of repeating alternating layers 4, 6. Typically, the multilayer structure 2 of the mirror 1 is formed by a number of 30 to 200 periods of alternating layers, i.e. a total number of layers between 60 and 400. Moreover, it should be noted that the Figures are schematic serving merely as illustrations and that they are not scale drawings.

Figure 6:
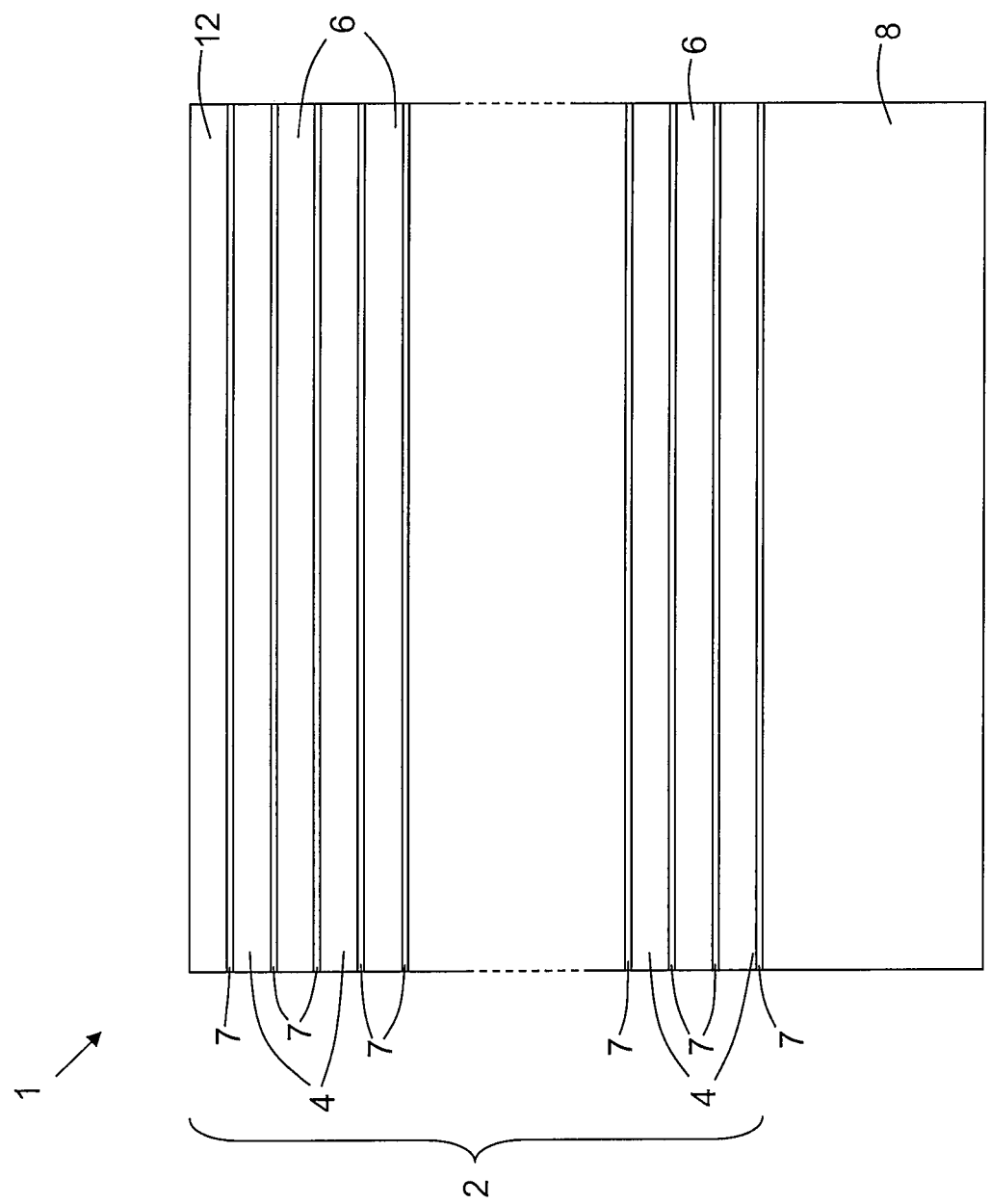
FIG. 6 depicts an embodiment of the multilayer mirror of the lithographic apparatus of FIG. 1.
Figure 7:
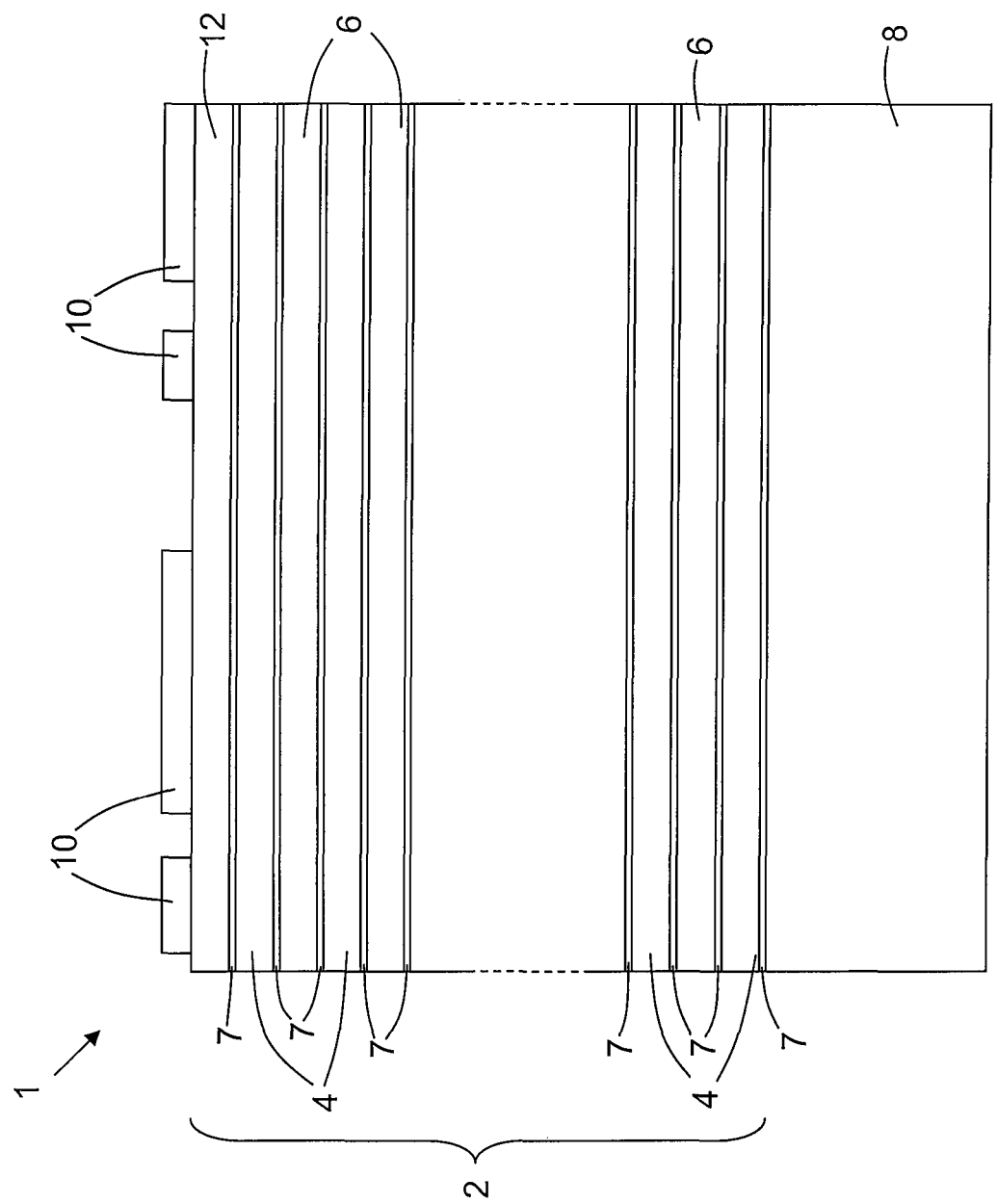
FIG. 7 depicts an embodiment of the multilayer mirror of the lithographic apparatus of FIG. 1.

Further embodiments of the multilayer mirror 1 are depicted in FIGS. 6 and 7. The embodiment of FIG. 6 is similar to the embodiment of FIG. 3. However, in the embodiment of FIG. 6, the layered structure 2 is provided with a capping layer 12. The capping layer 12 may include Ru, Ta, Ti, Rh, or any combination thereof. Such a capping layer may be suitably arranged to protect the layered structure of the multilayer mirror 1 against chemical attack. A suitable thickness for the capping layer may be anywhere within the range of 0.5 to 10 nm.

Another embodiment is depicted in FIG. 7. The embodiment of FIG. 7 is similar to the embodiment of FIG. 5. However, in the embodiment of FIG. 7, the layered structure 2 is provided with a capping layer 12. Same as mentioned while referring to FIG. 6, the capping layer 12 may comprise Ru, and/or Rh and may be suitably arranged to protect the layered structure of the multilayer mirror 1 against chemical attack.

Although specific reference may be made in this text to the use of lithographic apparatus in the manufacture of ICs, it should be understood that an embodiment of the multilayer mirror according to the invention may have interlayers, wherein an interlayer is a Sn layer and a further interlayer is a Mo layer, or wherein an interlayer is a Cr interlayer and a further interlayer is an interlayer containing other suitable material. In yet another embodiment, an Sn interlayer, a further Mo interlayer, and a yet further Cr interlayer may be provided. Also, it is possible that a multilayer mirror is provided having one or more interlayers, the interlayers including Sn alloys, Mo alloys or Cr alloys.

The lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A multilayer mirror constructed and arranged to reflect radiation having a wavelength in a range of about 6.4 nm-about 7.2 nm, the multilayer mirror having alternating layers, the alternating layers comprising a first layer and a second layer, the first and second layers being selected from the group consisting of: U and $B_4C$ layers, Th and $B_4C$ layers, U and $B_9C$ layers, Th and $B_9C$ layers, U and B layers, Th and B layers, U compound and $B_4C$ layers, Th compound and $B_4C$ layers, U compound and $B_9C$ layers, Th compound and $B_9C$ layers, U compound and B layers, and Th compound and B layers, wherein at least one of the first layers is separated from a second layer by an interlayer disposed between the at least one of the first layers and the second layer.

2. The multilayer mirror according to claim 1, wherein each first layer of a plurality of first layers is separated from a second layer by an interlayer.

3. The multilayer mirror according to claim 1, wherein the interlayer is selected from the group consisting of: a Sn layer, a Mo layer, a Cr layer, a Sn compound layer, a Mo compound layer, and a Cr compound layer.

4. The multilayer mirror according to claim 3, wherein the interlayer is a Sn compound layer, the Sn compound layer comprising at least one of the group consisting of $SnF_2$, $SnF_4$, $SnCl_2$, $SnCl_4$, $SnI_2$, $SnI_4$, SnO, $SnO_2$, SnSe, $SnSe_2$, and SnTe.

5. The multilayer mirror according to claim 3, wherein the interlayer is a Cr compound layer, the Cr compound layer comprising at least one of the group consisting of $CrF_2$, $CrF_3$, $CrF_4$, $CrCl_2$, $CrCl_3$, $CrCl_4$, $CrI_2$, $CrI_3$, $CrI_4$, $CrO_2$, $CrO_3$, $Cr_2O_3$, $Cr_3O_4$, CrN, CrSe, and $Cr_2Te_3$.

6. The multilayer mirror according to claim 3, wherein the interlayer is a Mo compound layer, the Mo compound layer comprising at least one of the group consisting of $MoF_3$, $MoF_4$, $MoCl_2$, $MoCl_3$, $MoCl_4$, $MoI_2$, $MoI_3$, $MoI_4$, MoO, $MoO_2$, $MoO_3$, $MoSe_2$, $MoTe_2$, and MoN.

7. The multilayer mirror according to claim 1, wherein a sum of a thickness of the first layer and a thickness of the second layer is within a range of about 2.2 nm-about 3.5 nm.

8. The multilayer mirror according to claim 1, wherein the interlayer has a thickness within a range of about 0.2 nm to about 1.0 nm.

9. The multilayer mirror according to claim 1, wherein the alternating layers have a period thickness which is between about 1.7 and about 2.5 times a thickness of the first layer or the second layer.

10. The multilayer mirror according to claim 1, wherein the multilayer mirror is a patterning device constructed and arranged to provide a beam of the radiation with a pattern in its cross-section.

11. The multilayer mirror according to claim 10, wherein the patterning device is a reticle or a mask.

12. The multilayer mirror according to claim 11, wherein the reticle or mask is provided with a structure having an absorptive material arranged to define the pattern, the absorptive material being Cr, Ta, Ti, Si, Ru, Mo, Al, or any combination thereof.

13. The multilayer mirror according to claim 1, wherein the multilayer mirror has a reflective surface provided with a capping layer comprising Ru, Rh, Ta, Ti, or any combination thereof.

14. A lithographic projection apparatus arranged to project a pattern from a patterning device onto a substrate, wherein the lithographic apparatus comprises a multilayer mirror constructed and arranged to reflect radiation having a wavelength in a range of about 6.4 nm-about 7.2 nm, the multilayer mirror having alternating layers, the alternating layers comprising a first layer and a second layer, the first and second layers being selected from the group consisting of: U and $B_4C$ layers, Th and $B_4C$ layers, U and $B_9C$ layers, Th and $B_9C$ layers, U and B layers, Th and B layers, U compound and $B_4C$ layers, Th compound and $B_4C$ layers, U compound and $B_9C$ layers, Th compound and $B_9C$ layers, U compound and B layers, and Th compound and B layers, wherein at least one of the first layers is separated from a second layer by an interlayer disposed between the at least one of the first layers and the second layer.

15. The lithographic apparatus according to claim 14, further comprising:
 an illumination system configured to condition a radiation beam;
 a support structure constructed to hold a patterning device, the patterning device being capable of imparting the radiation beam with a pattern in its cross-section to form a patterned radiation beam;
 a substrate table constructed to hold a substrate; and
 a projection system configured to project the patterned radiation beam onto a target portion of the substrate.

* * * * *